United States Patent [19]

Yamazaki

[11] Patent Number: 5,704,220

[45] Date of Patent: Jan. 6, 1998

[54] TESTING EQUIPMENT HAVING REFRIGERATOR INCORPORATED THEREIN

[75] Inventor: Hiroshi Yamazaki, Tokyo, Japan

[73] Assignee: Nagase Sangyo Kabushiki Kaisha, Osaka, Japan

[21] Appl. No.: 728,950

[22] Filed: Oct. 11, 1996

[30] Foreign Application Priority Data

Feb. 27, 1996 [JP] Japan .................................. 8-063909

[51] Int. Cl.[6] .................................................. F25D 19/00
[52] U.S. Cl. ............................. 62/259.2; 62/295; 62/297; 324/760
[58] Field of Search ......................... 62/125, 295, 297, 62/259.2, 100; 324/719, 760; 165/80.4; 209/573

[56] References Cited

U.S. PATENT DOCUMENTS

| | | | |
|---|---|---|---|
| 4,394,819 | 7/1983 | Averill | 62/295 X |
| 4,954,774 | 9/1990 | Binet | 324/760 |
| 5,084,671 | 1/1992 | Miyata et al. | 165/80.4 X |
| 5,628,195 | 5/1997 | Hill et al. | 62/297 X |

Primary Examiner—Harry B. Tanner
Attorney, Agent, or Firm—Steinberg, Raskin & Davidson, P.C.

[57] ABSTRACT

A testing equipment having a refrigerator incorporated therein which is capable of accomplishing a test for electrical characteristics of a tested object under stable circumstances substantially free from any vibration. A refrigerator and a counter balance put on a floor are connected together through a rigid structure of increased strength, to thereby minimize vibration of the refrigerator. Vibration-proof pads are arranged between the counter balance and the floor. Also, Rubber dampers are arranged between a frame and an upper wall plate. Further, vibration-proof pads are arranged between the frame and the floor. Such arrangement of the pads and dampers substantially prevents transmission of vibration of the refrigerator to both a prober actuation unit and a tested object holder.

6 Claims, 1 Drawing Sheet

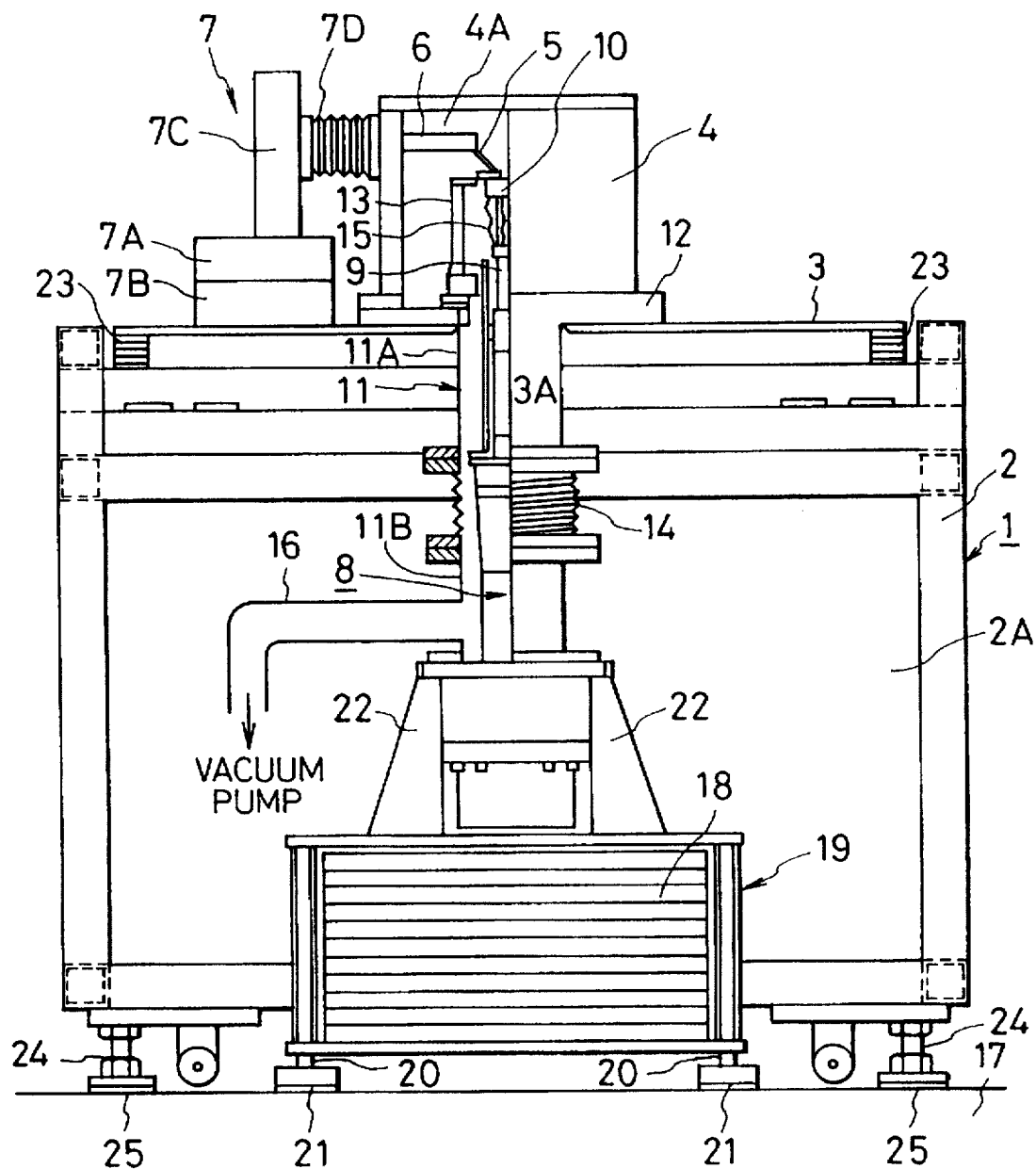

TESTING EQUIPMENT HAVING REFRIGERATOR INCORPORATED THEREIN

BACKGROUND OF THE INVENTION

This invention relates to a testing equipment having a refrigerator incorporated therein, and more particularly to a testing equipment for testing electrical characteristics of an object such as a semiconductor wafer or the like while keeping it at an ultra-low temperature set by means of a refrigerator.

A testing equipment which has been conventionally used in the art for testing electrical characteristics of a semiconductor element at an ultra-low temperature is constructed so as to include a chamber structure having a chamber defined therein and kept at a predetermined degree of vacuum, an ultra-low temperature refrigerator which has a cooling head arranged so as to be accessible to the chamber and is adapted to use helium as a refrigerant, a wafer holder arranged in the chamber and cooled by the cooling head of the ultra-low temperature refrigerator by conduction, and a testing prober having a probe provided thereon in a manner to be removably inserted into the chamber.

The conventional testing equipment thus constructed is adapted to test electrical characteristics of a semiconductor wafer which is an object to be tested (hereinafter also referred to as "tested object") while setting it on the wafer holder.

In the conventional testing equipment constructed as described above, the chamber structure and an actuation unit for actuating the prober are supported on an upper surface of an upper wall plate carried on a support and the refrigerator is supported in a space defined in the support while being hung from the upper wall plate in such a manner that the cooling head of the refrigerator is positioned in the chamber of the chamber structure through an opening formed through the upper wall plate and connected to the wafer holder through a heat transfer medium.

Unfortunately, in the conventional testing equipment, the refrigerator is suspendedly supported on the upper wall plate merely formed of a thin plate material, so that vibration generated from the refrigerator is transmitted through the upper wall plate to the chamber structure and the actuation unit for the prober which are supported on the upper plate, as well as through the cooling head and the heat transfer medium to the wafer holder.

Such transmission of the vibration causes vibration of the semiconductor wafer and prober, resulting in a deterioration in accuracy in the test. Thus, it is highly desirable that a test for electrical characteristics of a semiconductor wafer by means of a prober is carried out under stable circumstances substantially free from any vibration.

SUMMARY OF THE INVENTION

The present invention has been made in view of the foregoing disadvantage of the prior art.

Accordingly, it is an object of the present invention to provide a testing equipment which is capable of permitting testing circumstances set at an ultra-low temperature by means of a refrigerator incorporated therein to be rendered stable.

It is another object of the present invention to provide a testing equipment which is capable of substantially preventing external vibration from being transmitted to both a tested object and a prober.

It is a further object of the present invention to provide a testing equipment which is capable of performing a test for electrical characteristics of a tested object under stable circumstances substantially free from any vibration.

In accordance with the present invention, a testing equipment which has a refrigerator incorporated therein is provided. The testing equipment generally includes a support formed with a mounting hole and arranged on an installation plane, a chamber structure arranged on the support, a testing prober including a probe inserted into the chamber structure, an actuation unit for actuating the testing prober, a tested object holder arranged in the chamber structure, a refrigerator having a cooling head fixedly mounted thereon and arranged so as to be accessible to an interior of the chamber structure through the mounting hole of the support, wherein the cooling head is connected to the tested object holder through a heat transfer medium, so that a tested object held on the tested object holder may be cooled through the tested object holder when it is subject to testing by the testing prober. The testing equipment of the present invention is featured in that a counter weight is arranged on the installation plane and connected to the refrigerator and vibration-proof means are arranged between the support and the installation plane and between the counter weight and the installation plane, respectively.

In a preferred embodiment of the present invention, the testing equipment further includes a plurality of plate members arranged at a boundary between a lower surface of the refrigerator and an upper surface of the counter weight so as to constitute a rigid structure of a substantially triangular shape, resulting in being joined to the refrigerator and counter weight, so that the refrigerator and counter weight are connected to each other through the plate members.

In a preferred embodiment of the present invention, the support includes a frame supported on the installation plane and an upper wall plate supported on an upper surface of the frame through a vibration-proof means.

In a preferred embodiment of the present invention, the testing equipment further includes a vacuum source for evacuating the interior of the chamber structure to a predetermined degree of vacuum, which vacuum source is arranged so as to communicate with the chamber structure directly or through a communication pipe, and a vibration removing means arranged at one of a connection between the vacuum source and the chamber structure and a connection between the communication pipe and the chamber structure.

In a preferred embodiment of the present invention, the heat transfer medium is selected from the group consisting of a copper wire and a wire mesh member formed of a copper wire.

In a preferred embodiment of the present invention, the testing equipment further includes a cover connected at an upper end thereof to the chamber structure and arranged so as to surround an outer periphery of the refrigerator, which cover is divided into an upper cover section and a lower cover section, and a bellows interposedly arranged between the upper cover section and the lower cover section.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein:

the single FIGURE is a front elevation view partly in section showing an embodiment of a testing equipment having a refrigerator incorporated therein according to the present invention.

DETAILED DESCRIPTION OF THE PREFERRED EMBODIMENT

Now, a testing equipment according to the present invention will be described hereinafter with reference to the accompanying drawings.

Referring now to the single FIGURE, an embodiment of a testing equipment having a refrigerator incorporated therein according to the present invention is generally illustrated, which is constructed in the form of a semiconductor wafer testing equipment. More particularly, a testing equipment of the illustrated embodiment is adapted to test various characteristics of a semiconductor element in the form of a wafer at an ultra-low temperature.

For this purpose, the semiconductor wafer testing equipment of the illustrated embodiment generally includes a support 1 constituted by a frame 2 having a space 2A defined therein so as to function as a machine room, an upper wall plate 3 supported on the frame 2, a chamber structure 4 carried on an upper surface of the upper wall plate 3 formed with a mounting hole 3A and having a measuring chamber 4A defined therein, a testing prober 6 having a probe 5 inserted into the measuring chamber 4A, an actuation unit 7 for actuating the prober 6 which is carried on the upper surface of the upper wall plate 3, and a refrigerator 8 arranged in the space 2A of the frame 2.

In the semiconductor wafer testing equipment of the illustrated embodiment constructed as described above, the refrigerator 8 includes a cooling head 9 arranged in the measuring chamber 4A of the chamber structure 4. The measuring chamber 4A is provided therein with a holder 10 for holding thereon a semiconductor wafer which is a tested object placed in the measuring chamber 4A of the chamber structure 4. The refrigerator 8 is connected to the cooling head 9 and semiconductor wafer holder 10 through a heat transfer medium 15 as described hereinafter.

More particularly, the chamber structure 4 is constructed in a box-like and airtight manner and provided at an appropriate portion thereof with an opening (not shown) through which a semiconductor wafer is accessed to the chamber 4A. The opening is provided in an openable manner.

The refrigerator 8 may include in addition to the above-described cooling head 9, a compressor and the like as conventionally know in the art, so that the measuring chamber 4A of the chamber structure 4 may be cooled to an ultra-low temperature. For this purpose, the refrigerator 8 may use helium as a refrigerant therefor.

The refrigerator 8 is mounted thereon with a cover 11 in a manner to surround an outer periphery of the refrigerator 8. The cover 11 is connected at an upper end thereof to a lower end of the chamber structure 4 through a flange 12. The flange 12 is supported on the above-described upper surface of the upper wall plate 3. The cover 11 is supported together with the refrigerator 8 in the machine room 2A through the mounting hole 3A of the upper wall plate 3 while being hung from the upper wall plate 3.

The measuring chamber 4A of the chamber structure 4, as described above, is provided therein with the semiconductor wafer holder 10 in a manner to be positioned above the cooling head 9. The holder 10 may be made of, for example, a copper plate and is supported on the flange 12 through four support rods 13 mounted on the flange 12. The support rods 13 each may be made of a heat insulating material such as ceramic or the like or a material inferior in heat transfer such as stainless steel, to thereby minimize transfer of a temperature in the measuring chamber 4A to the semiconductor wafer holder 10. The support rods 13 each may be formed into a tube-like shape.

The cover 11 is divided into two parts or an upper cover section 11A and a lower cover section 11B, between which a bellows 14 is interposedly connected so as to absorb possible vibration of the refrigerator 8.

The semiconductor wafer holder 10 is connected to the cooling head 9 through the heat transfer medium 15 briefly described above, so that heat of the cooling head 9 may be transmitted to the holder 10 therethrough. The heat transfer medium 15 may comprise a copper wire or a copper stranded wire made by stranding a plurality of single copper wires together. Alternatively, the heat transfer medium 15 may comprise a wire mesh member such as a copper wire mesh member made of a copper wire. Such formation of a copper wire material into the heat transfer medium 15 functions to absorb vibration of the refrigerator 8, as in the bellows 14.

The testing prober 6 may be constructed in any suitable manner known in the art. The actuation unit 7 for actuating the testing prober 6 includes stages 7A, 7B and 7C arranged so as to be movable in X–Y–Z directions or longitudinal, lateral and vertical directions, respectively, as well as an arm 7D mounted on the stages.

When electrical characteristics of a semiconductor wafer held on the semiconductor wafer holder 10 are to be measured, the arm 7D is extended to move or transfer the probe 5 from a stand-by position to a position near the holder 10 and then the stages 7A, 7B and 7C are selectively operated, to thereby be suitably positioned in the X–Y–Z directions, resulting in being contacted with a semiconductor wafer, so that electrical characteristics of the semiconductor wafer may be measured.

The testing equipment of the illustrated embodiment is provided with a vacuum source (not shown) such as a vacuum pump or the like which functions to evacuate the measuring chamber 4A of the chamber structure 4 to a predetermined degree of vacuum. In the illustrated embodiment, the vacuum pump may be arranged outside the semiconductor wafer testing equipment and connected through a piping 16 to the cover 11 which is arranged so as to communicate with the measuring chamber 4A of the chamber structure 4, resulting in communicating with the chamber 4A.

Now, the manner of operation of the semiconductor wafer testing equipment of the illustrated embodiment constructed as described above will be described hereinafter.

First, the refrigerator 8 and vacuum pump are started or activated, so that the measuring chamber 4A of the chamber structure 4 may be set at predetermined temperature and pressure. Then, a semiconductor wafer is put on the holder 10 and then the probe 5 is contacted with the semiconductor wafer as described above, resulting in electrical characteristics of the semiconductor wafer and the like being measured.

Now, vibration proofing constructed in the semiconductor wafer testing equipment of the illustrated embodiment will be described hereinafter.

The refrigerator 8 is connected to a counter weight 18 placed on an installation plane provided by a floor 17, in a manner to be rigidly integrated with the counter weight 18. More specifically, the counter weight 18 which is made of iron and formed into a predetermined weight is placed in the machine room 2A of the frame 2 while being received in a housing 19. The housing 19 is provided on a bottom thereof with four support legs 20. Reference numeral 21 designates a vibration-proof pad arranged between a bottom surface of each of the support legs 20 and the installation plane 17, to thereby exhibit a vibration-proof function.

Thus, the refrigerator 8 is put on an upper surface of the housing 19 in which the counter weight 18 is received and connected to the counter weight 18 by means of a rigid structure 22 of, for example, a substantially triangular shape arranged at a boundary between a lower surface of the refrigerator 8 and an upper surface of the counter weight 18 and joined to the refrigerator 8 and counter weight 18. In the illustrated embodiment, the rigid structure 22 may comprise an angle frame of increased strength made of a plurality of rigid plate members. For example, the angle frame 22 may be made of eight iron plate members.

In the illustrated embodiment, the support 1 is constituted by the frame 2 supported on the floor 17 and the upper wall plate 3 supported on the upper surface of the frame 2 through a vibration-proof means 23. The vibration-proof means 23 may comprise, for example, a predetermined number of dampers 23 made of a rubber material. Such dampers 23 in a predetermined number may be arranged on the upper surface of the frame 2. For example, four such dampers 23 may be put thereon. Thereafter, the upper wall plate 3 is placed on the dampers 23.

A further vibration-proof means 25 is arranged between the frame 2 and the floor 17. The vibration-proof means 25 may comprise a vibration-proof pad mounted on a lower surface of a level foot 24 fixed on each of four corners of a lower surface of the frame 2. The level feet 24 function to adjust a height of the frame 2 as desired.

Thus, in the illustrated embodiment, the refrigerator 8 and the counter weight 18 arranged on the floor 17 are connected to each other through the angle frame 22 of increased strength, to thereby provide the above-described rigid structure by cooperation with each other. This permits the refrigerator 8 to be stationarily supported in the machine room 2A, to thereby minimize vibration of the refrigerator 8.

Also, the vibration pads 21 are interposedly arranged between the lower surface of the housing 19 of the counter weight 18 and the floor 17, resulting in minimizing transmission of vibration form the refrigerator 8 to the floor 17 and that from the floor 17 to the refrigerator 8. Transmission of vibration between the frame 2 and the floor 17 is substantially blocked or interrupted by the vibration-proof pads 25 each mounted on the lower surface of each of the level feet 24 mainly functioning to adjust a height of the frame 2.

Further, the upper wall plate 3 on which the chamber structure 4 and prober actuation unit 7 are supported is arranged through the rubber dampers 23 on the upper surface of the frame 2 supported on the floor 17, so that vibration unwillingly transmitted from the refrigerator 8 through the floor 17 to the support 1 due to a failure in absorption by the vibration-proof pads 21 and 25 is substantially kept from being transmitted to the chamber structure 4 and prober actuation unit 7. The bellows 14 and heat transfer medium 15 each function to directly absorb vibration generated from the refrigerator 8.

Thus, it will be noted that the above-described vibration-proof structure substantially prevents vibration generated from the refrigerator 8 from being transmitted to the chamber structure 4 and the actuation unit 7 for the prober 6. Also, it substantially keeps the vibration from being transmitted through the cooling head 9 and heat transfer 15 to the holder 10. This permits a test for electrical characteristics of a semiconductor wafer by the prober to be readily carried out under stable circumstances substantially free from any vibration, so that the test may be performed with increased accuracy.

Vibration of the vacuum pump which is transmitted through the piping 16 to the testing equipment is readily absorbed or removed by the bellows 14. Alternatively, the testing equipment of the illustrated embodiment may be constructed in such a manner that the vacuum pump is arranged in an interior of the semiconductor wafer testing equipment such as, for example, in the machine room 2A, resulting in communicating directly with the measuring chamber 4A of the chamber structure 4. In such construction, a vibration-proof mechanism such as a bellows or the like may be arranged at a connection between the vacuum pump and the chamber structure 4.

As can be seen from the foregoing, the above-described construction of the present invention substantially prevents transmission of vibration of the refrigerator to the region between the support and the installation plane, to thereby prevent vibration of the tested object and prober during driving of the refrigerator. Thus, the present invention permits a test by the prober to be readily carried out under stable circumstances substantially free from any vibration, to thereby significantly increase accuracy in the test.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A testing equipment having a refrigerator incorporated therein, comprising:

a support formed with a mounting hole and arranged on an installation plane;

a chamber structure arranged on said support;

a testing prober including a probe inserted into said chamber structure;

an actuation unit for actuating said testing prober;

a tested object holder arranged in said chamber structure;

a refrigerator having a cooling head fixedly mounted thereon and arranged so as to be accessible to an interior of said chamber structure through said mounting hole of said support;

said cooling head being connected to said tested object holder through a heat transfer medium, so that a tested object held on said tested object holder may be cooled through said tested object holder when it is subject to testing by said testing prober;

a counter weight arranged on said installation plane and connected to said refrigerator; and vibration-proof means arranged between said support and said installation plane and between said counter weight and said installation plane, respectively.

2. A testing equipment as defined in claim 1, further comprising a plurality of plate members arranged at a boundary between a lower surface of said refrigerator and an upper surface of said counter weight so as to constitute a rigid structure of a substantially triangular shape, resulting in being joined to said refrigerator and counter weight;

said refrigerator and counter weight being connected to each other through said plate members.

3. A testing equipment as defined in claim 1, wherein said support includes a frame supported on said installation plane and an upper wall plate supported on an upper surface of said frame through a vibration-proof means.

4. A testing equipment as defined in any one of claim 1, further comprising a vacuum source for evacuating the interior of said chamber structure to a predetermined degree of vacuum;

said vacuum source being arranged so as to communicate with said chamber structure directly or through a communication pipe; and a vibration removing means arranged at one of a connection between said vacuum source and said chamber structure and a connection between said communication pipe and said chamber structure.

5. A testing equipment as defined in any one of claim 1, wherein said heat transfer medium is selected from the group consisting of a copper wire and a wire mesh member formed of a copper wire.

6. A testing equipment as defined in any one of claim 1, further comprising a cover connected at an upper end thereof to said chamber structure and arranged so as to surround an outer periphery of said refrigerator;

said cover being divided into an upper cover section and a lower cover section; and a bellows interposedly arranged between said upper cover section and said lower cover section.

* * * * *